(12) United States Patent
Gilliland et al.

(10) Patent No.: US 8,482,934 B2
(45) Date of Patent: Jul. 9, 2013

(54) IMPLEMENTING SURFACE MOUNT COMPONENTS WITH SYMMETRIC REFERENCE BALANCE

(75) Inventors: Don A. Gilliland, Rochester, MN (US); David B. Johnson, Rochester, MN (US); Dennis J. Wurth, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 350 days.

(21) Appl. No.: 13/011,140

(22) Filed: Jan. 21, 2011

(65) Prior Publication Data
US 2012/0188742 A1   Jul. 26, 2012

(51) Int. Cl.
*H05K 7/02* (2006.01)

(52) U.S. Cl.
USPC ........ 361/811; 361/303; 361/306.1; 361/313; 361/321.2; 361/328; 174/264; 333/193

(58) Field of Classification Search
USPC ............... 361/811, 303, 306.1, 313, 321.2, 361/328; 174/264; 333/193
See application file for complete search history.

(56) References Cited

U.S. PATENT DOCUMENTS

| | | | | |
|---|---|---|---|---|
| 5,590,016 | A | * | 12/1996 | Fujishiro et al. ............... 361/313 |
| 6,906,910 | B1 | * | 6/2005 | Gilliland et al. ............... 361/328 |
| 2003/0151471 | A1 | * | 8/2003 | Yamada et al. ................ 333/193 |

* cited by examiner

*Primary Examiner* — Xiaoliang Chen
(74) *Attorney, Agent, or Firm* — Joan Pennington

(57) ABSTRACT

A method and structure are provided for implementing surface mount components with symmetric reference balance. A first reference and an incoming signal are received in a surface mounted device (SMD) package and a second reference and the outgoing signal are output from the SMD package. A capacitor structure is defined within the SMD package between the first reference and the second reference. The capacitor structure includes a balanced impedance structure between the first reference and the second reference. A component connected between the received incoming signal and output signal is generally centrally located within the capacitor structure.

20 Claims, 7 Drawing Sheets

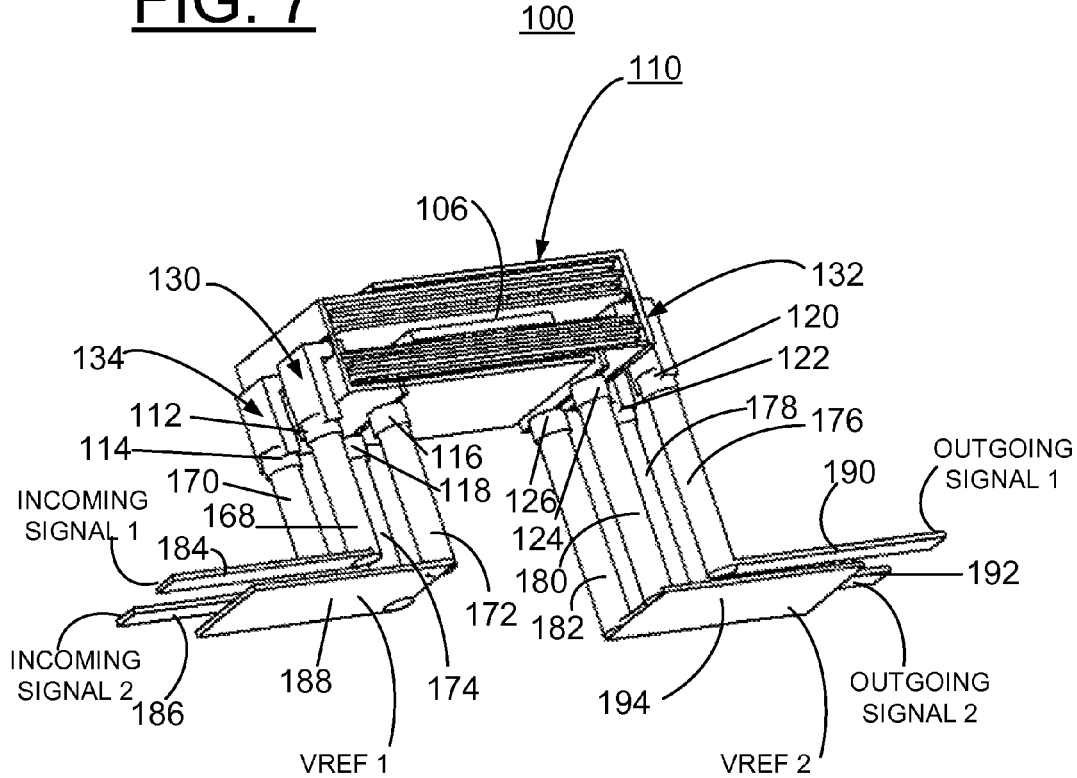

IMPLEMENTING SURFACE MOUNT COMPONENTS WITH SYMMETRIC REFERENCE BALANCE

FIELD OF THE INVENTION

The present invention relates generally to the data processing field, and more particularly, relates to a method and structure for implementing surface mount components with symmetric reference balance.

DESCRIPTION OF THE RELATED ART

Differential mode logic is quite common and has routinely replaced single ended logic in high speed electronics. The opportunity exists to improve the differential to common mode conversion as generated by differential mode logic, and for single ended logic when a signal line switches references on a printed circuit board by crossing split planes.

A concern exists when a single component or dual component connection is brought to the top or bottom of a printed circuit board, oftentimes the reference is left behind internally. Since differential mode signals should be referenced to themselves this should not be a problem. However, since nearby coupling occurs and due to skew of the signaling some differential mode to common mode conversion occurs.

The common mode reference, to be effective at returning differential common mode currents, should in theory be continuous. However, circuit design can force some components to cross reference planes. In this regard, the common mode return signals become interrupted and thus must use displacement capacitance to return to the source of the common mode conversion. This action causes radiation emission from the circuit board itself.

U.S. Pat. No. 6,906,910 to Don Alan Gilliland and Dennis James Wurth issued Jun. 14, 2005, and assigned to the assignee as the present application, discloses structures for implementing an integrated conductor and capacitor in a surface mounted device (SMD) package. A first pair and a second pair of contacts contained within the SMD package respectively are provided in mating engagement with a first pair and a second pair of corresponding SMD package contacts. A conductor extends between the first pair of contacts, contained within the SMD package. A capacitor is defined between the second pair of contacts, contained within the SMD package.

While the above identified patent provides significant improvements over prior art arrangements, a need exists for an enhanced structure for implementing surface mount components with symmetric reference balance.

SUMMARY OF THE INVENTION

Principal aspects of the present invention are to provide a method and structure for implementing surface mount components with symmetric reference balance. Other important aspects of the present invention are to provide such method and structure substantially without negative effects and that overcome many of the disadvantages of prior art arrangements.

In brief, a method and structure are provided for implementing surface mount components with symmetric reference balance. A first reference and an incoming signal are received in a surface mounted device (SMD) package and a second reference and the outgoing signal are output from the SMD package. A capacitor structure is defined within the SMD package between the first reference and the second reference. The capacitor structure includes a balanced impedance structure between the first reference and the second reference. A component is connected between the received incoming signal and output signal and is generally centrally located within the capacitor structure.

In accordance with features of the invention, to improve the response to common mode, a symmetric transfer of references is used. The capacitor structure is used to tightly couple the two references in close proximity to the component or dual components to maintain the common mode impedance and for tight coupling to the component or dual components.

In accordance with features of the invention, the capacitor structure includes a first sidewall and a second opposed sidewall. Each sidewall includes a plurality of spaced apart parallel fingers or plate members that connect to the first reference and the second reference on each side. The first reference is connected to a bottom plate member connected to the first sidewall and the second reference is connected to an adjacent plate to the bottom plate member connected to the second sidewall. The first reference is brought into close proximity to the bottom of the component. The second reference is brought in close proximity to the top of the component. This tight coupling on bottom and top of the differential components causes the reference to transition essentially through the SMD package component.

In accordance with features of the invention, the capacitor structure includes a first sidewall and a second opposed sidewall. Each sidewall includes, for example, five spaced apart parallel fingers or plate members that respectively connect to the first reference and the second reference on each side. A top plate member and a bottom plate member are balanced members. A first plate member in close proximity to the bottom of the components is connected to the first reference. A second plate member in close proximity to the top of the components is connected to the second reference. The first plate member and the second plate member are configured to have substantially identical impedance. Each sidewall includes a substantially central disposed window for connecting a component connected between the received incoming signal and the output signal.

BRIEF DESCRIPTION OF THE DRAWINGS

The present invention together with the above and other objects and advantages may best be understood from the following detailed description of the preferred embodiments of the invention illustrated in the drawings, wherein:

FIGS. 6 and 7 are top and bottom perspective views illustrating not to scale the example structure for implementing surface mount components with symmetric reference balance of FIG. 1 with dual pairs of electrical connecting pins together with a respective contact pad in accordance with the preferred embodiment.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, improvements are provided for differential to common mode conversion as generated by differential mode logic. In order to improve the response to common mode, a method and structure of the invention uses a symmetric transfer of references. Within the component, capacitance is used to tightly couple the two references in close proximity to differential components to maintain the common mode impedance and tight coupling to the differential component. Within the component, a first reference is brought into close proximity to the bottom of the differential components, and a second reference is brought in close proximity to the top of the differential components with the resulting tight coupling on the bottom and top of the differential components and transition of the reference essentially through the differential components.

Figure 1:
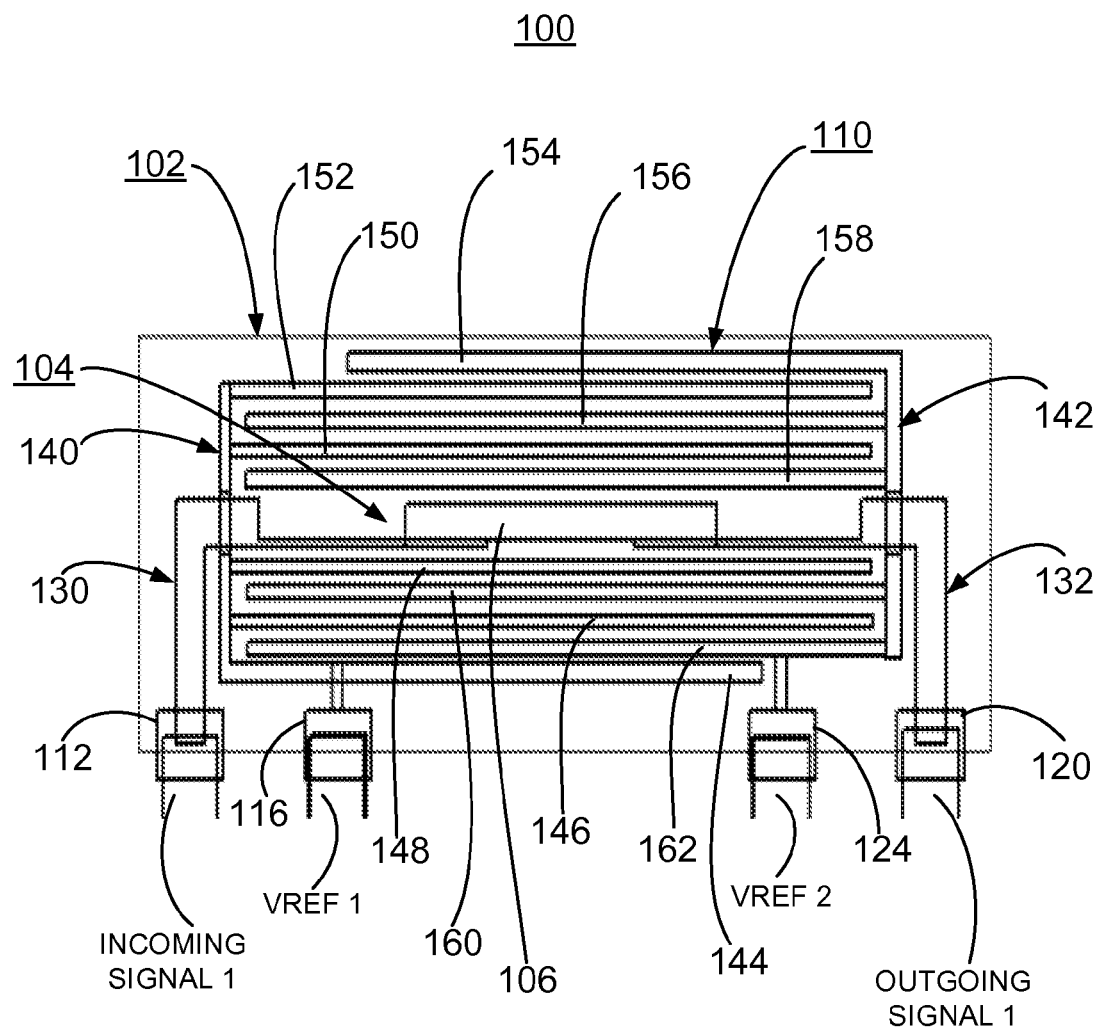
FIG. 1 is a diagram schematically illustrating not to scale a side view of an example structure for implementing surface mount components with symmetric reference balance in accordance with the preferred embodiment.

Having reference now to the drawings, in FIG. 1, there is shown an example structure for implementing differential surface mount components with symmetric reference balance generally designated by the reference character 100 in accordance with the preferred embodiment. The symmetric reference balance structure 100 includes an example enclosure or surface mounted device (SMD) package 102.

Figure 2:
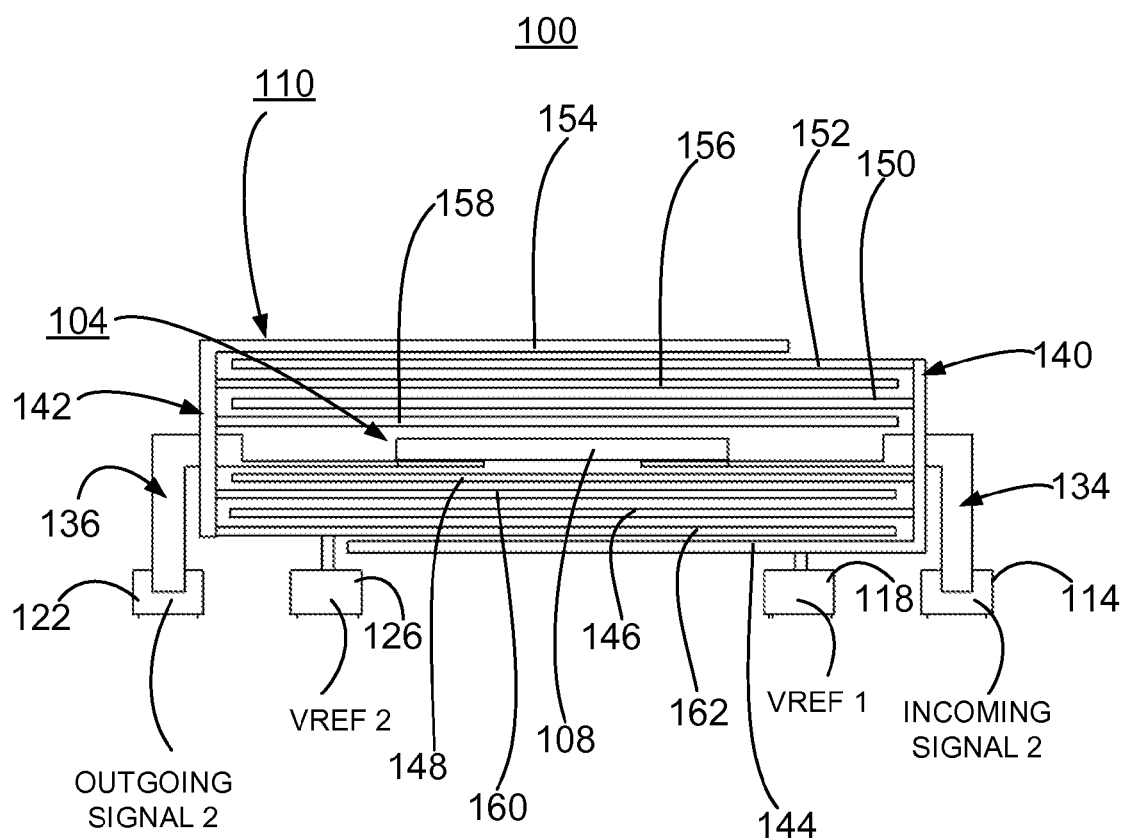
FIG. 2 illustrates not to scale an opposite side view of the example structure for implementing surface mount components with symmetric reference balance of FIG. 1 in accordance with the preferred embodiment.

Referring also to FIG. 2, there is shown an opposite side view from FIG. 1 of the example symmetric reference balance structure 100 in accordance with a preferred embodiment. A first reference VREF 1 and dual differential signals INCOMING SIGNAL 1, INCOMING SIGNAL 2 are received in the SMD package 102 and a second reference VREF 2 and the dual differential signals OUTGOING SIGNAL 1, OUTGOING SIGNAL 2 are transferred from the SMD package. Generally centered within the symmetric reference balance structure 100 is a set 104 of dual components 106, 108. Exemplary components 106, 108 within the symmetric reference balance structure 100 include resistors, capacitors, diodes, continuous conductors, and the like.

While a set 104 of dual components 106, 108 are illustrated and described, it should be understood that the present invention is not limited to the illustrated arrangement. It should be understood that the present invention is applicable to both a single component and dual components used with a single ended signal or signals, dual signals, and differential signals.

A capacitor structure generally designated by the reference character 110 within the symmetric reference balance structure 100 is used to tightly couple the two references VREF 1, VREF 2 in close proximity to the dual components 106, 108 to maintain the common mode impedance and tight coupling to the dual components.

Each of the respective dual signals or differential signals INCOMING SIGNAL 1, INCOMING SIGNAL 2 is applied to a respective outer contact pad 112, 114, and the first reference VREF 1 is applied to a pair of outer contact pads 116, 118. Each of the respective signals OUTGOING SIGNAL 1, OUTGOING SIGNAL 2 is applied to a respective outer contact pad 120, 122, and the second reference VREF 2 is applied to a pair of outer contact pads 124, 126.

As shown in FIG. 1, the signal INCOMING SIGNAL 1 applied to the outer contact pad 112 is connected to the component 106 by an electrically conductive member 130. The signal OUTGOING SIGNAL 1 applied to the outer contact pad 120 is connected to the component 106 by an electrically conductive member 132.

As shown in FIG. 2, the signal INCOMING SIGNAL 2 applied to the outer contact pad 114 is connected to the component 108 by an electrically conductive member 134. The signal OUTGOING SIGNAL 2 applied to the outer contact pad 122 is connected to the component 108 by an electrically conductive member 136.

In accordance with features of the invention, symmetric reference balance structure 100 provides a symmetric transfer of references to improve the response to common mode. The capacitor structure 110 is used to tightly couple the two references VREF 1, VREF 2 in close proximity to the components 106, 108 to maintain the common mode impedance and for tight coupling to the components. The change in reference occurs outside the stackup of an associated printed circuit board (not shown) where the change in reference cannot excite the multitude of vias within the printed circuit board structure that contribute to the overall EMC performance of the printed circuit board.

The capacitor structure 110 includes a first sidewall 140 and a second opposed sidewall 142. Each sidewall 140, 142 includes a plurality of spaced apart parallel fingers or plate members 144, 146, 148, 150, 152; and 154, 156, 158, 160, 162 that respectively connect to contact pads 116 and the first reference VREF 1 and contact pads 124 and the second reference VREF 2. The contact pads 116 and first reference VREF 1 connected to the bottom plate member 144 is connected to the first sidewall 140 and contact pads 124 and the second reference VREF 2 connected to the plate member 162 adjacent to the bottom plate member 144 is connected to the second sidewall 142.

While as shown each sidewall 140, 142 includes five fingers or plate members 144, 146, 148, 150, 152; and 154, 156, 158, 160, 162, it should be understood that the present invention is not limited to the illustrated arrangement. It should be understood that more fingers would provide a more tightly coupled capacitor structure that only improves the capacitance coupling at high frequencies.

The first reference plate member 148 is brought into close proximity to the bottom of the components 106, 108. The second reference plate member 158 is brought in close proximity to the top of the components 106, 108. This tight coupling on bottom and top of the components 106, 108 causes the reference to transition essentially through the SMD package components. The contact pads 116 and the first reference VREF 1 and contact pads 124 and the second reference VREF 2 are tightly coupled at high frequency by the capacitor structure 110. The capacitance coupling amount is related to the area of, and distance between the plates member 144, 146, 148, 150, 152; and 154, 156, 158, 160, 162 and the dielectric used with the plate members.

In accordance with features of the invention, the first sidewall 140 and plate members 144, 146, 148, 150, 152 and the second opposed sidewall 142 and plate members 154, 156, 158, 160, 162 of the capacitor structure 110 are balanced, with substantially perfect symmetry. In the capacitor structure 110, the top plate member 154 and the bottom plate member 162 are balanced members. The first plate member 148 in close proximity to the bottom of the components 106, 108 connected to the first reference VREF 1 and the second plate member 158 in close proximity to the top of the components 106, 108 connected to the second reference VREF 2 are balanced members. The first plate member 148 proximate to the bottom of the components 106, 108 and the second plate member 158 proximate to the top of the components 106, 108 of the capacitor structure 110 are configured to have substantially identical impedance.

Some reference numbers on subsequent figures are, for simplicity, not carried forward unless a component or item is specifically described with respect to the description of a figure.

Figure 3:
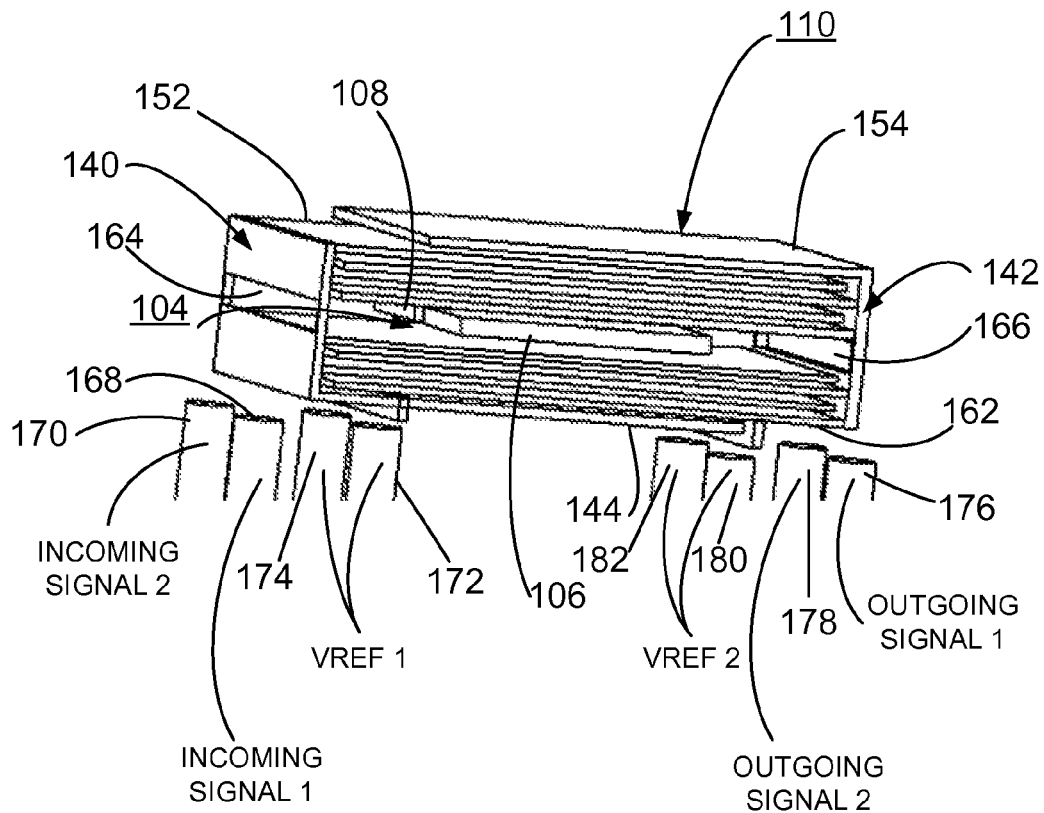
FIG. 3 is a fragmentary perspective view illustrating not to scale a set of dual components of the example structure for implementing surface mount components with symmetric reference balance of FIG. 1 together with dual pairs of electrical connecting pins in accordance with the preferred embodiment.
Figure 4:
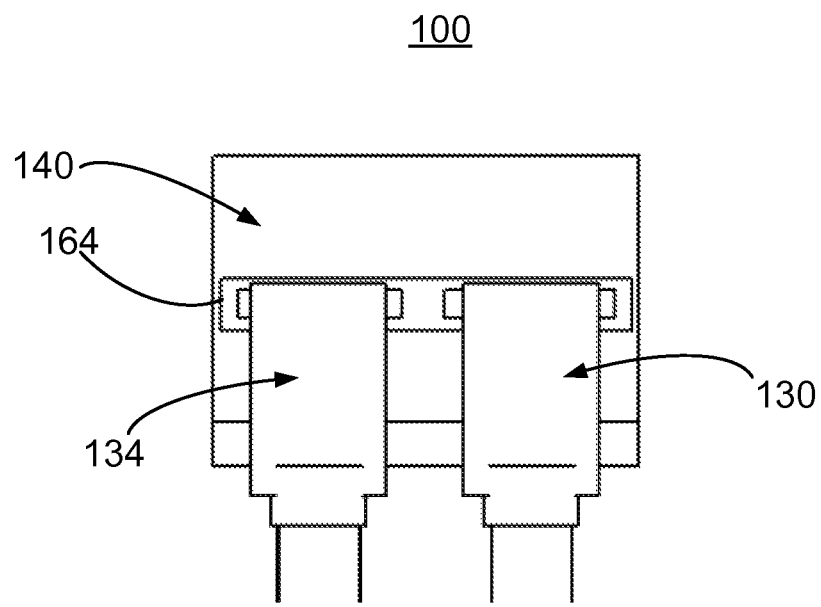
FIG. 4 is a fragmentary end view illustrating not to scale a pair of signal connections of the example structure for implementing surface mount components with symmetric reference balance of FIG. 1 in accordance with the preferred embodiment.

Referring to FIGS. 3 and 4, there is shown a respective window 164, 166 substantially centrally disposed within the first sidewall 140 and the second opposed sidewall 142. In FIG. 3, the set 104 of dual components 106, 108 is shown together with an example pair of pins 168, 170 respectively receiving the INCOMING SIGNAL 1, INCOMING SIGNAL 2 and a pair of pins 172, 174 receiving the reference VREF 1 and an example pair of pins 176, 178 respectively receiving the OUTGOING SIGNAL 1, OUTGOING SIGNAL 2 and a pair of 180, 182 receiving the reference VREF 2. In FIG. 4, example signal connection members 130, 134 are shown with the window 164 within the first sidewall 140.

Figure 5:
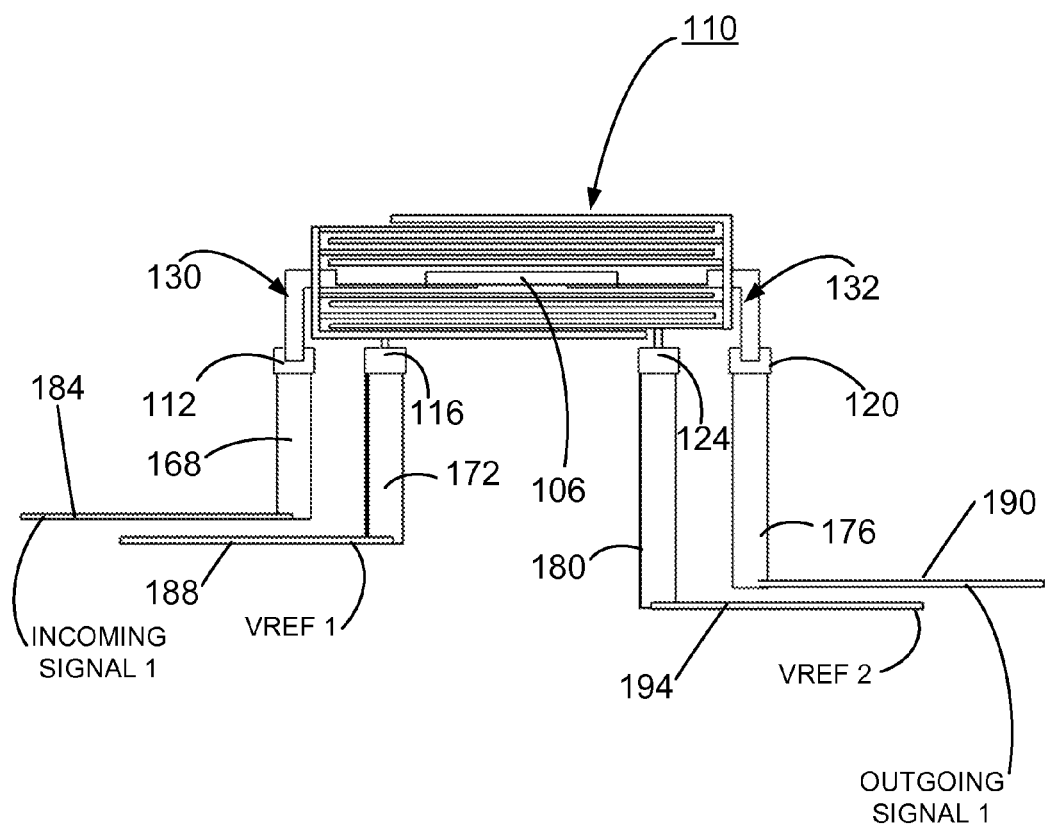
FIG. 5 schematically illustrates not to scale the side view of an example structure of FIG. 1 with dual electrical connecting pins together with a respective contact pad in accordance with the preferred embodiment.
Figure 6:
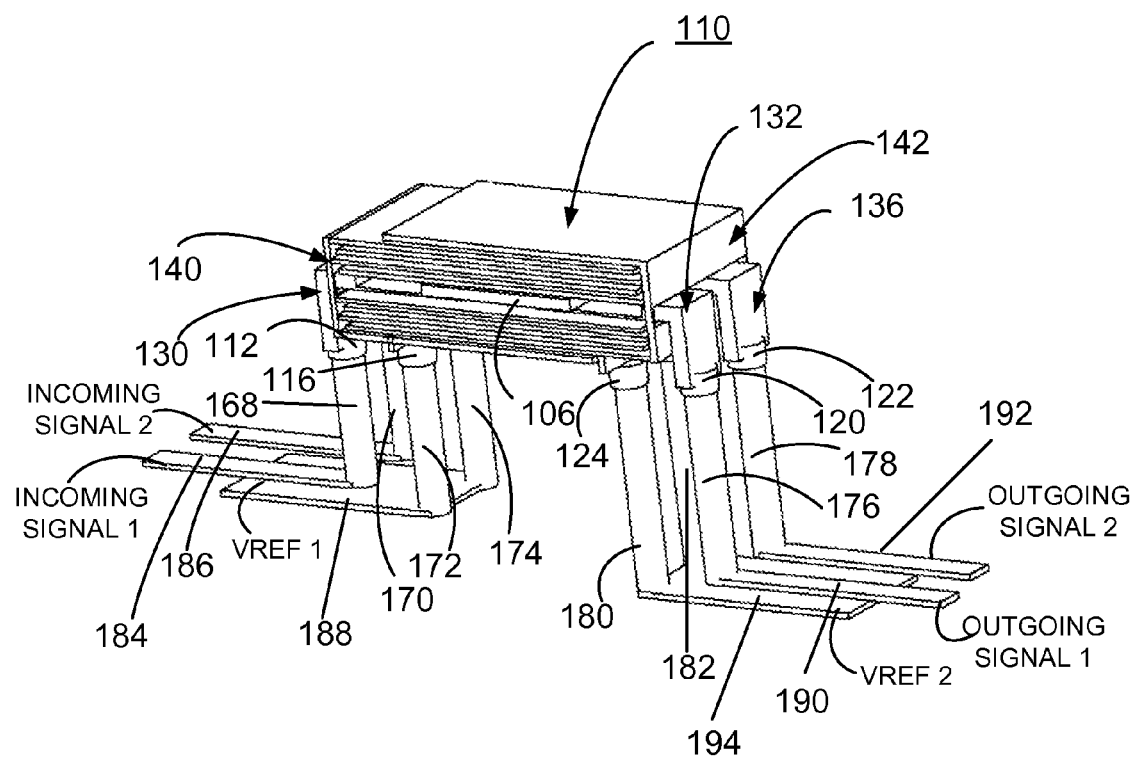

Referring to FIGS. 5, 6, and 7 schematically illustrate a respective contact pad 184, 186 together with dual pins 168, 170 respectively receiving the INCOMING SIGNAL 1, INCOMING SIGNAL 2 and a respective contact pad 188 together with the pins 172, 174 receiving the reference VREF 1 and a respective contact pad 190, 192 together with pins 176, 178 respectively receiving the OUTGOING SIGNAL 1, OUTGOING SIGNAL 2 and a respective contact pad 194 together with pins 180, 182 receiving the reference VREF 2.

As shown in FIG. 5, the signal INCOMING SIGNAL 1 is coupled from the contact pad 184 and pin 168 to the outer contact pad 112 and connected to the component 106 by the electrically conductive member 130. The signal OUTGOING SIGNAL 1 is coupled from the contact pad 190 and pin 176 to the outer contact pad 120 and connected to the component 106 by an electrically conductive member 132.

As shown in FIGS. 6 and 7, the signal INCOMING SIGNAL 2 is coupled from the contact pad 186 and pin 170 to the outer contact pad 114 and connected to the component 108 shown in FIGS. 2 and 3 by the electrically conductive member 134. The signal OUTGOING SIGNAL 2 is coupled from the contact pad 192 and pin 178 to the outer contact pad 122 and connected to the component 108 by electrically conductive member 136.

As shown in FIG. 7, the first reference VREF 1 is coupled from the contact pad 188 and pins 172, 174 to the outer contact pads 116, 118 and the capacitor structure 110. The second reference VREF 2 is coupled from the contact pad 194 and pins 180, 182 to the outer contact pads 124, 126 and the capacitor structure 110.

The final encapsulation may be interspersed with conductive fibers thus increasing the shielding effectiveness of the component, while the capacitance fingers that make up the capacitor structure tends to form a shielded cavity. Also a dielectric material, such as NPO, X7R, X5R, COG, YTV, and the like, can be used to generally surround the capacitor structure 110. The dielectric material is a poor conductor of electricity, while an efficient supporter of electrostatic fields that can store energy and particularly useful in capacitor structure 110.

While the present invention has been described with reference to the details of the embodiments of the invention shown in the drawing, these details are not intended to limit the scope of the invention as claimed in the appended claims.

What is claimed is:

1. A structure for implementing surface mount components with symmetric reference balance comprising:
   a surface mounted device (SMD) package receiving a first reference and incoming signal; said SMD package outputting a second reference and an outgoing signal;
   a capacitor structure disposed within said SMD package defined by a balanced impedance structure between the first reference and the second reference;
   a component connected between the incoming signal and outgoing signal, and generally centrally located within said capacitor structure.

2. The structure for implementing surface mount components as recited in claim 1 wherein said capacitor structure provides a symmetric transfer of references.

3. The structure for implementing surface mount components as recited in claim 1 wherein said capacitor structure couples said first and said second references in close proximity to said component to maintain common mode impedance and provides coupling to said component.

4. The structure for implementing surface mount components as recited in claim 1 wherein said capacitor structure includes a first sidewall and a second opposed sidewall.

5. The structure for implementing surface mount components as recited in claim 4 wherein each said sidewall includes a plurality of spaced apart parallel plate members, said first sidewall connected to the first reference and said second opposed sidewall connected to the second reference.

6. The structure for implementing surface mount components as recited in claim 4 wherein said first reference is connected to a bottom plate member connected to the first sidewall and said second reference is connected to an adjacent plate to the bottom plate member connected to the second sidewall.

7. The structure for implementing surface mount components as recited in claim 4 wherein said first reference includes a plate member in close proximity to the bottom of said component and said second reference includes a plate member in close proximity to the top of said component.

8. The structure for implementing surface mount components as recited in claim 7 wherein said capacitor structure provides coupling on the bottom and top of said component and the references transitions essentially through said SMD package component.

9. The structure for implementing surface mount components as recited in claim 1 wherein said capacitor structure includes a first sidewall and a second opposed sidewall; and each sidewall includes five spaced apart parallel plate members; said first sidewall connected to said first reference and said second sidewall connected to said second reference.

10. The structure for implementing surface mount components as recited in claim 9 wherein a first plate member in close proximity to the bottom of said component is connected to said first sidewall connected to said first reference; and a second plate member in close proximity to the top of said component is connected to said second sidewall connected to said second reference.

11. The structure for implementing surface mount components as recited in claim 10 wherein said first plate member and said second plate member are configured to have substantially identical impedance.

12. The structure for implementing surface mount components as recited in claim 9 wherein each said sidewall includes a substantially central disposed window.

13. The structure for implementing surface mount components as recited in claim 12 wherein at least one electrically conductive member extends through said window in each said sidewall, each said electrically conductive member connected to said component.

14. A method for implementing surface mount components with symmetric reference balance comprising:
    providing a surface mounted device (SMD) package receiving a first reference and incoming signal; said SMD package outputting a second reference and an outgoing signal;
    defining a capacitor structure within said SMD package by a balanced impedance structure connected between the first reference and the second reference;
    providing a component connected between the received incoming signal and outgoing signal and generally centrally located within said capacitor structure.

15. The method as recited in claim 14 includes said capacitor structure providing a symmetric transfer of references.

16. The method as recited in claim 14 includes said capacitor structure coupling said first reference and said second reference in close proximity to said component to maintain common mode impedance and provides coupling to said component.

17. The method as recited in claim 14 wherein defining a capacitor structure within said SMD package by a balanced impedance structure connected between the first reference and the second reference includes providing said capacitor structure includes a first sidewall and a second opposed sidewall; connecting said first sidewall to said first reference; and connecting said second sidewall to said second reference.

18. The method as recited in claim 17 includes providing a plurality of parallel plate members extending from each of said first sidewall and said second opposed sidewall.

19. The method as recited in claim 18 includes providing a first plate member in close proximity to the bottom of said component connected to said first sidewall and said first reference; and providing a second plate member in close proximity to the top of said component connected to said second sidewall and said second reference.

20. The method as recited in claim 18 includes configuring said first plate member and said second plate member to have substantially identical impedance.

\* \* \* \* \*